United States Patent
Rahm et al.

(10) Patent No.: US 8,837,031 B2
(45) Date of Patent: Sep. 16, 2014

(54) FINITE-EMBEDDED COORDINATE DESIGNED TRANSFORMATION-OPTICAL DEVICES

(75) Inventors: Marco Rahm, Kaiserslautern-Erfenbach (DE); David R. Smith, Durham, NC (US); David A. Schurig, Durham, NC (US)

(73) Assignee: Duke University, Durham, NC (US)

( * ) Notice: Subject to any disclaimer, the term of this patent is extended or adjusted under 35 U.S.C. 154(b) by 1238 days.

(21) Appl. No.: 12/268,295

(22) Filed: Nov. 10, 2008

(65) Prior Publication Data

US 2009/0147342 A1 Jun. 11, 2009

Related U.S. Application Data

(60) Provisional application No. 60/987,014, filed on Nov. 9, 2007, provisional application No. 60/987,127, filed on Nov. 12, 2007.

(51) Int. Cl.
| | |
|---|---|
| *G02B 26/00* | (2006.01) |
| *G02F 1/01* | (2006.01) |
| *G02F 1/23* | (2006.01) |
| *G02B 27/46* | (2006.01) |

(52) U.S. Cl.
CPC .............. *G02F 1/01* (2013.01); *G02F 2202/30* (2013.01)
USPC ........... 359/240; 359/238; 359/278; 359/559; 359/561

(58) Field of Classification Search
USPC ............ 359/29, 238, 278, 315, 559, 561; 361/233; 333/116, 156, 204; 343/700
See application file for complete search history.

(56) References Cited

U.S. PATENT DOCUMENTS

| | | | |
|---|---|---|---|
| 6,236,507 B1* | 5/2001 | Hill et al. ...................... | 359/287 |
| 6,859,114 B2 | 2/2005 | Eleftheriades et al. | |
| 7,015,865 B2 | 3/2006 | Isaacs et al. | |
| 7,446,929 B1 | 11/2008 | Jayaraman et al. | |
| 7,764,232 B2* | 7/2010 | Achour et al. ......... | 343/700 MS |
| 8,026,862 B2* | 9/2011 | Pendry et al. ................. | 343/851 |
| 2008/0024792 A1* | 1/2008 | Pendry et al. ................. | 356/602 |
| 2010/0141358 A1* | 6/2010 | Akyurtlu et al. ........... | 333/219.1 |

OTHER PUBLICATIONS

Donderici, Burkay, et al. "Subgridding with Domain Overriding for FDTD", 2004, IEEE, vol. 1, p. 61-64.*
Marco Rahm et al., "Optical Design of Reflectionless Compex Media by Finite Embedded Coordinate Transformations", Physical Review Letters, PRL 100, 063903, Feb. 15, 2008 (4 pages).
Marco Rahm et al., "Optical Design of Reflectionless Compex Media by Finite Embedded Coordinate Transformations", APS/123-QED, Sep. 9, 2007 (5 pages).
J.B. Pendry et al., "Controlling Electromagnetic Fields", Science vol. 312, Jun. 23, 2006 (10 pages).

(Continued)

*Primary Examiner* — Mahidere Sahle
(74) *Attorney, Agent, or Firm* — Nixon & Vanderhye P.C.

(57) ABSTRACT

The design method for complex electromagnetic materials is expanded from form-invariant coordinate transformations of Maxwell's equations to finite embedded coordinate transformations. Embedded transformations allow the transfer of electromagnetic field manipulations from the transformation-optical medium to another medium, thereby allowing the design of structures that are not exclusively invisible. A topological criterion for the reflectionless design of complex media is also disclosed and is illustrated in conjunction with the topological criterion to design a parallel beam shifter and a beam splitter with unconventional electromagnetic behavior.

27 Claims, 7 Drawing Sheets

(56) References Cited

OTHER PUBLICATIONS

Ulf Leonhardt et al., "Optical Conformal Mapping", Science vol. 312, Jun. 23, 2006 (5 pages).
M. Rahm et al., "Transformation-optical design of adaptive beam bends and beam expanders", Optics Express vol. 16, No. 15, Jul. 21, 2008, pp. 11555-11567.
Do-Hoon Kwon et al., "Polarization splitter and polarization rotator designs based on transformation optics", Optics Express vol. 16, No. 23, Nov. 10, 2008, pp. 18731-18738.
Na Liu et al., "Three-dimensional photonic metamaterials at optical frequencies", Nature Materials, vol. 7, Jan. 2008 (published online Dec. 2, 2007), pp. 31-37.
Ker Than, "The Magic of Metamaterials", Duke Magazine, vol. 93, No. 2, Mar.-Apr. 2007 (7 pages).
Xiaofei Xu et al., "Electromagnetic beam modulating through transformation optical structures", Jun. 2008 (15 pages).
Metamaterial—Wikipedia, the free encyclopedia (printed from web site Oct. 29, 2008) (8 pages).
Alexandra Boltasseva et al., "Fabrication of optical negative-index metamaterials: Recent advances and outlook", Metamaterials, vol. 2, Mar. 18, 2008, pp. 1-17.
D. Schurig et al., "Metamaterial Electromagnetic Cloak at Microwave Frequencies", Science, vol. 314, Nov. 10, 2006, pp. 977-980.
Steven A. Cummer et al., "Full-wave simulations of electromagnetic cloaking structures", Physical Review, E 74, 036621, 2006 (5 pages).
D. Schurig et al., "Calculation of material properties and ray tracing in transformation media", Optics Express, vol. 14, No. 21, Oct. 16, 2006, pp. 9794-9804.
Wenshan Cai et al., "Non-Magnetic Cloak without Reflection", arXiv:0707.3641v1 [physics.optics], 2007 (8 pages).
Marco Rahm et al., "Design of electromagnetic cloaks and concentrators using form-invariant coordinate transformations of Maxwell's equations", arXiv:0706.2452v1, also: doi:10.1016/j.photonics.2007.07.013, 2007 (3 pages).
E.J. Post, Formal Structure of Electromagnetics: General Covariance and Electromagnetics, Dover Publications, 1997 (204 pages).
J.E. Inglesfield, "A method of embedding", J. Phys. C: Solid State Phys. vol. 14, 1981, pp. 3795-3806.

\* cited by examiner

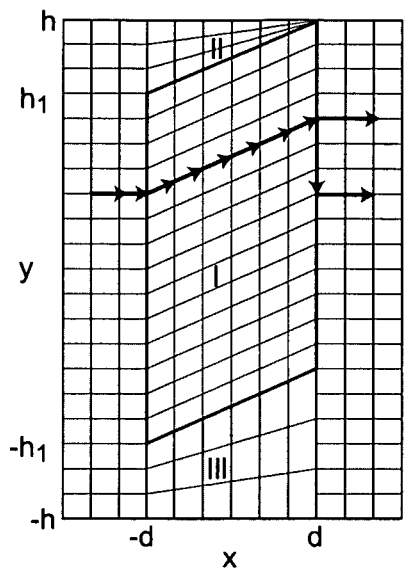
Figure 1: Example illustrative non-limiting Linear spatial Coordinate Transformation for a parallel beam shifter.
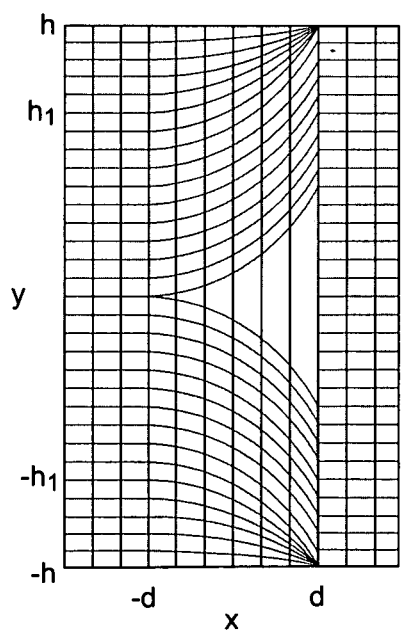
Figure 2: Nonlinear spatial coordinate transformation of second order for a beam divider.

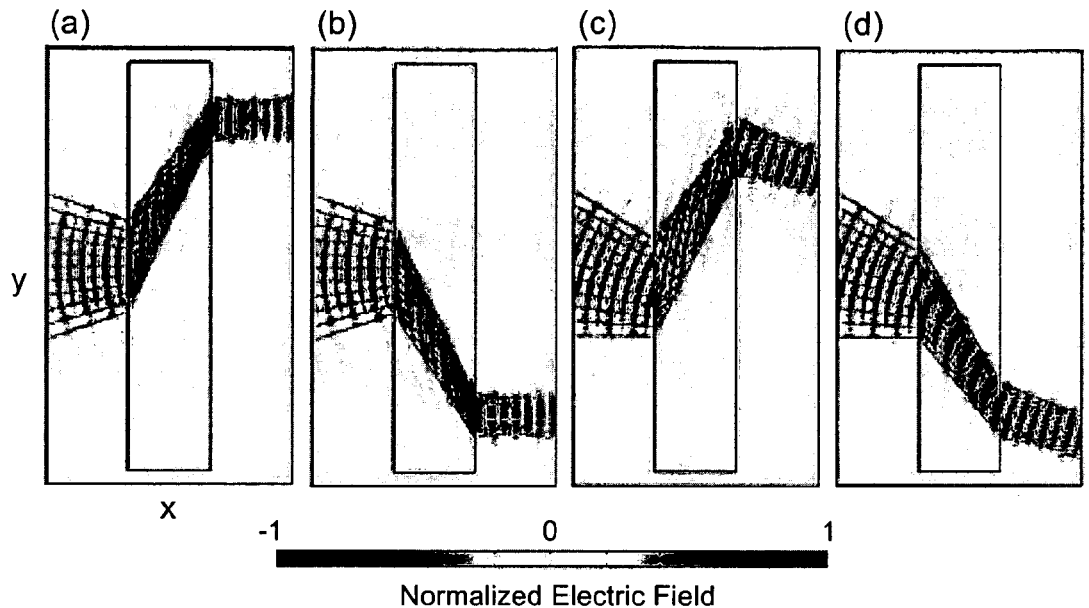
Figure 3: Example illustrative non-limiting electric field phasor for a convergent wave at normal (a+b) and oblique incidence (c+d) on a parallel beam shifter for two different shift positions.
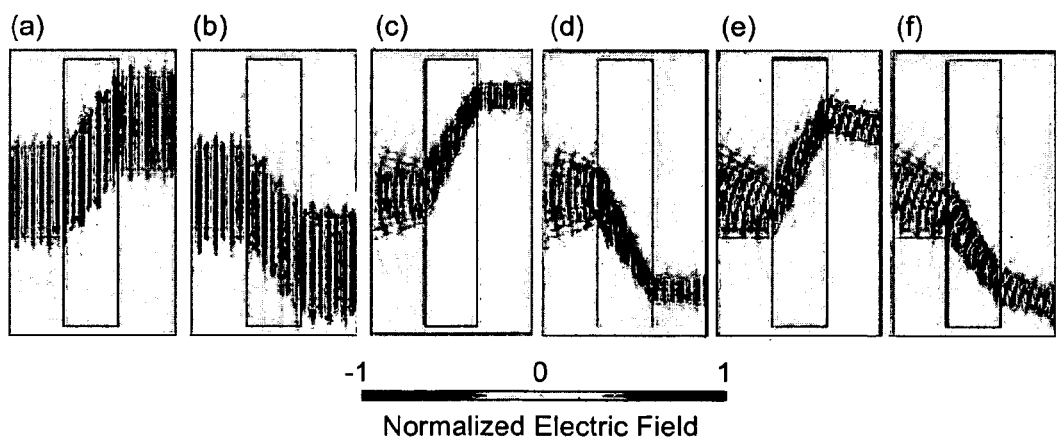
Figure 4: Exemplary illustrative non-limiting electric field distribution and power flow lines of a parallel beam shifter for diffracting plane waves.

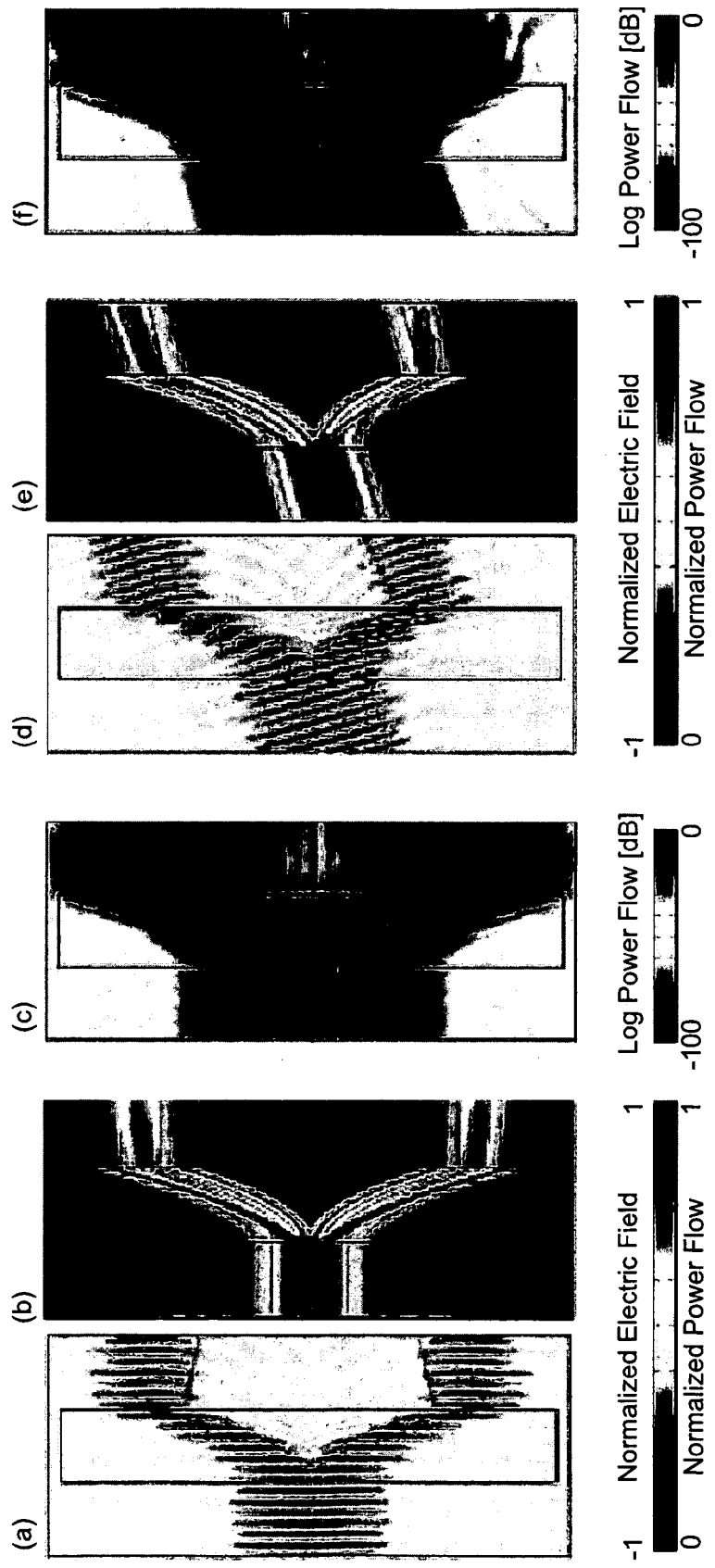
Figure 5: Example illustrative non-limiting electric field distribution and power flow lines (a) & (d), and power flow on a linear scale (b) & (e), and logarithmic scale (c) & (f) of a beam splitter for diffracting plane waves.

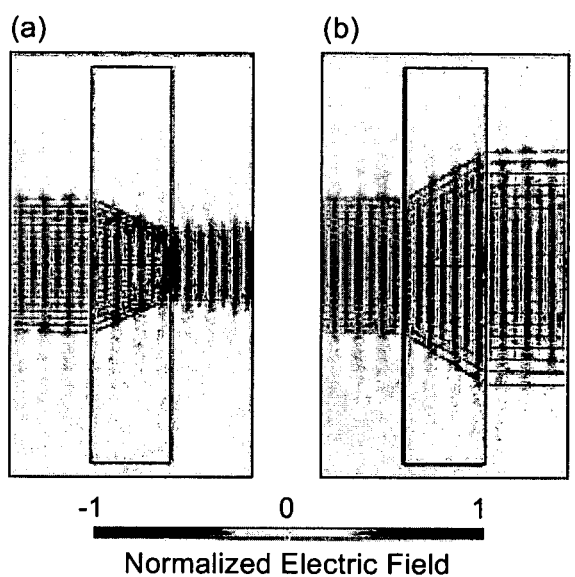
Figure 6: Example illustrative non-limiting beam focusing (a) and expanding unit (b) designed by the embedded coordinate transformation approach.

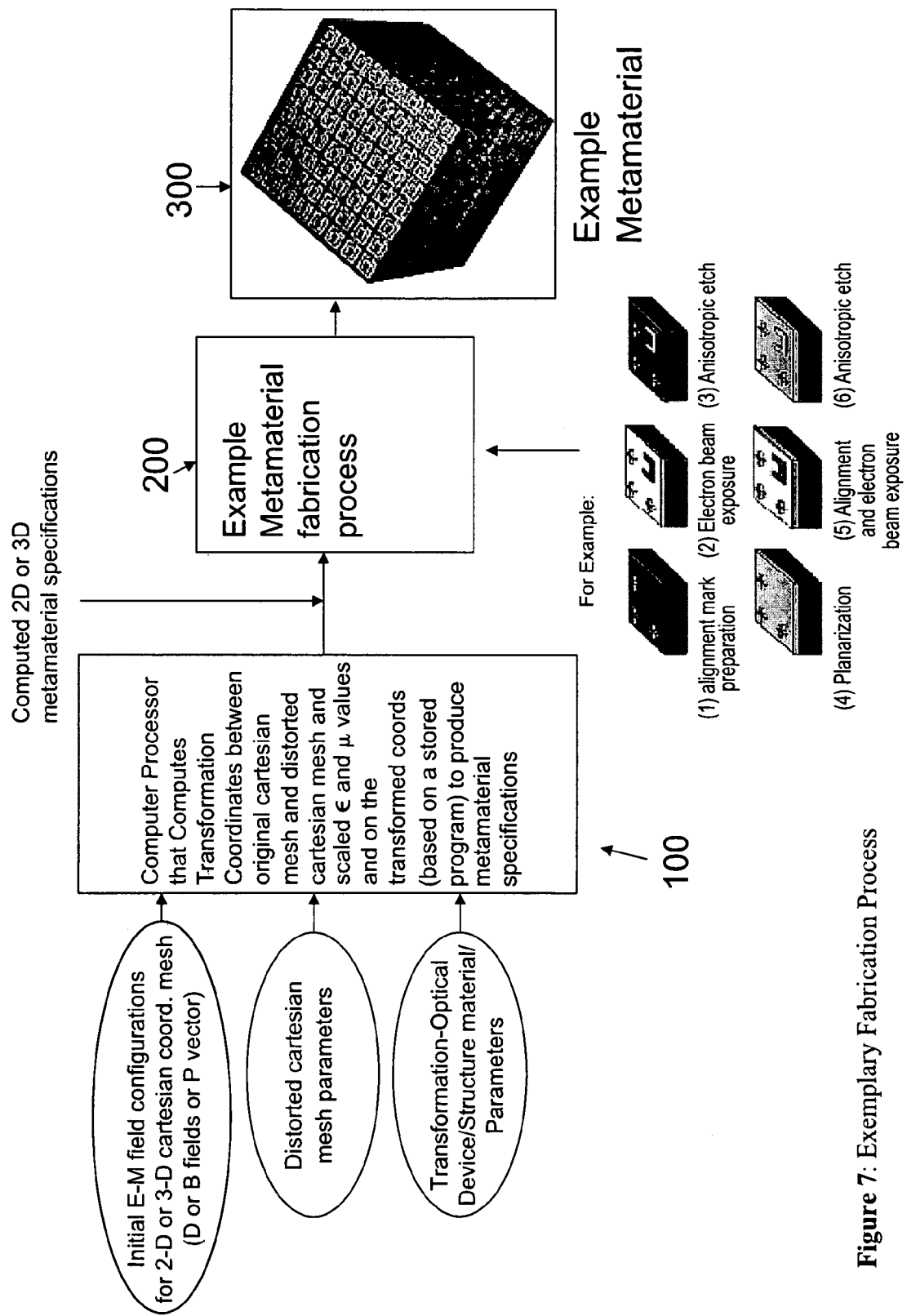
Figure 7: Exemplary Fabrication Process

FINITE-EMBEDDED COORDINATE DESIGNED TRANSFORMATION-OPTICAL DEVICES

CROSS-REFERENCES TO RELATED APPLICATIONS

This application claims the benefit of priority from provisional application No. 60/987,014 filed Nov. 9, 2007, and from provisional application No. 60/987,127 filed Nov. 12, 2007, the contents of which are incorporated herein by reference.

FIELD

The technology herein relates to optical phenomena, and more particularly to complex electromagnetic materials that allow the transfer of electromagnetic field manipulations from the transformation-optical medium to another medium. The technology herein also relates to parallel beam shifters and beam splitters with unconventional electromagnetic behavior.

BACKGROUND AND SUMMARY

Metamaterials offer an enormous degree of freedom for manipulating electromagnetic fields, as independent and nearly arbitrary gradients can be introduced in the components of the effective permittivity and permeability tensors. In order to exploit such a high degree of freedom, a viable method for the well-aimed design of complex materials would be desirable.

Pendry et al., Science 312, 1780 (2006) reported a methodology based on continuous form-invariant coordinate transformations of Maxwell's equations which allows for the manipulation of electromagnetic fields in a previously unknown and unconventional fashion. This method was successfully applied for the design and the experimental realization of an invisibility cloak and generated widespread interest specifically in the prospects of electromagnetic cloaking—a topic that has dominated much of the subsequent discussion.

The methodology presented in Pendry et al makes use of form-invariant continuous coordinate transformations of Maxwell's equations. The use of continuous transformations provides a complex transformation-optical material which is invisible to an external observer. In other words, the field modifications precipitated in the transformation-optical device generally may not be transferred to another medium and the original electromagnetic properties of waves impinging on the medium are restored as soon as the waves exit the optical component. Transformation-optical designs reported in the literature so far generally have in common that the electromagnetic properties of the incident waves are exclusively changed within the restricted region of the transformation-optical device. However, for the sake of the continuity of the transformation, the field manipulation cannot be transferred to another medium or free space and thus remains an, in many cases, undesired local phenomenon.

It would be desirable to have also a tool for the design of electromagnetic/optical components that takes advantage of the high degree of design freedom provided by the transformation-optical approach, but allows the transfer of field manipulations outside the transformation-optical material. Such a method would allow the creation of optical devices with unconventional electromagnetic/optical behavior and functionality that exceeds the abilities of conventional components like lenses, beam steerers, beam shifters, beam splitters and similar.

The technology herein expands the design method for complex electromagnetic materials from form-invariant coordinate transformations of Maxwell's equations to finite embedded coordinate transformations. In contrast to continuous transformations, embedded transformations allow the transfer of electromagnetic field manipulations from the transformation-optical medium to another medium, thereby allowing the design of structures that are not exclusively invisible. The illustrative exemplary non-limiting implementations provide methods to design such novel devices by a modified transformation-optical approach. The conceived electromagnetic/optical devices can be reflectionless under certain circumstances.

The exemplary illustrative non-limiting technology herein further delivers a topological criterion for the reflectionless design of complex media. This exemplary illustrative non-limiting expanded method can be illustrated in conjunction with the topological criterion to provide an example illustrative non-limiting parallel beam shifter and beam splitter with unconventional electromagnetic behavior.

The concept of embedded coordinate transformations significantly expands the idea of the transformation-optical design of metamaterials which itself was restricted to continuous coordinate transformations so far. The expansion to embedded transformations allows for non-reversibly change to the properties of electromagnetic waves in transformation media and for transmission of the changed electromagnetic properties to free space or to a different medium in general. In order to design the medium as reflectionless, a new topological criterion for the embedded transformations can be used to impose constraints to the metric of the spaces at the interface between the transformation-optical medium and the surrounding space. This metric criterion can be applied in the conception of a parallel beam shifter and a beam splitter and confirmed in 2D full wave simulations. Such exemplary illustrative non-limiting devices can provide an extraordinary electromagnetic behavior which is not achievable by conventional materials. Such examples clearly state the significance of embedded coordinate transformations for the design of new electromagnetic elements with tunable, unconventional optical properties.

BRIEF DESCRIPTION OF THE DRAWINGS

These and other features and advantages will be better and more completely understood by referring to the following detailed description of exemplary non-limiting illustrative implementations in conjunction with the drawings of which:

FIG. 1 shows an exemplary illustrative non-limiting implementation of a linear spatial coordinate transformation for the conception of an exemplary illustrative non-limiting parallel beam shifter of thickness 2d (in this example, the maximally allowed beam width of the incoming beam is 2h1);

FIG. 2 shows an exemplary illustrative non-limiting implementation of a non-linear spatial coordinate transformation of second order for an exemplary illustrative non-limiting beam divider;

FIGS. 3a-3d show illustrative exemplary illustrative non-limiting electric field phasors for a convergent wave at normal (a+b) and oblique incidence (c+d) on a parallel beam shifter for two different shift positions;

FIG. 4a-4f shows exemplary illustrative non-limiting electric field distribution (color map) and power flow lines (grey) of a parallel beam shifter for diffracting plane waves with shift parameters (a) a=1:8, (b) −1.8, for a convergent beam under perpendicular incidence with (c) a=2, (d)=−2 and for oblique incidence with (e) a=2 and (f) a=−1:2;

FIGS. 5a-5f show illustrative non-limiting electric field distribution (color map), power flow lines (grey) (a+d) and power flow on a linear (b+e) and logarithmic scale (c+f) of a beam splitter for diffracting plane waves with shift parameters (a–c) |a|=15 for perpendicular incident waves and (d–f) |a|=12 for oblique incidence;

FIG. 6 shows an exemplary illustrative non-limiting beam focusing (a) and expanding unit (b) designed by the embedded coordinate transformation approach;

FIG. 7 shows a diagram of an exemplary illustrative non-limiting system for designing and manufacturing a transformation-optical device.

DETAILED DESCRIPTION

Figure 8:
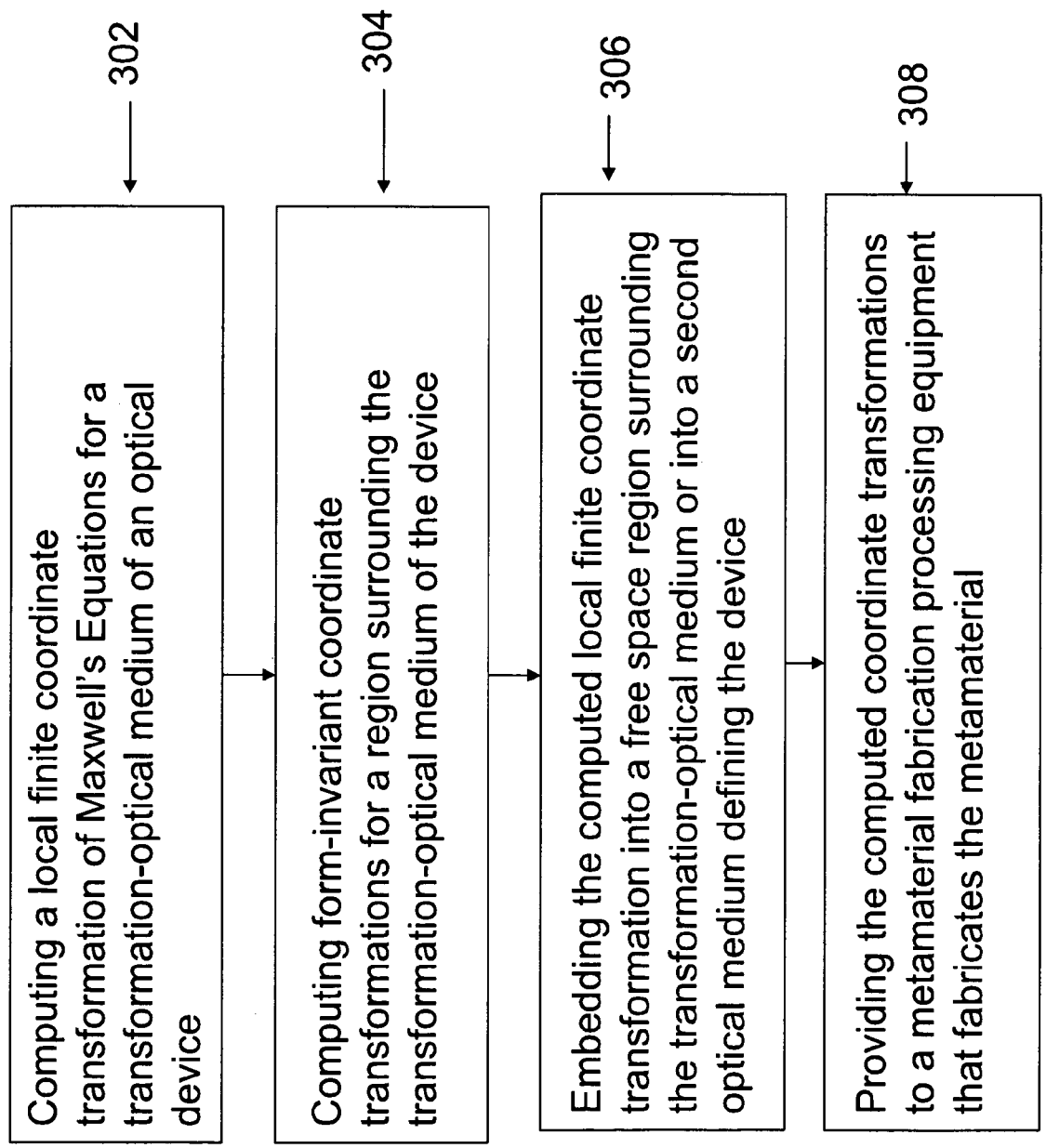
FIG. 8 shows an exemplary illustrative non-limiting fabrication process.

The exemplary illustrative non-limiting technology herein provides a generalized approach to the method of form-invariant coordinate transformations of Maxwell's equations based on finite embedded coordinate transformations. The use of embedded transformations adds a significant amount of flexibility to the transformation design of complex materials. For example, with finite-embedded transformations, it is possible to transfer field manipulations from the transformation-optical medium to a second medium, eliminating the requirement that the transformation optical structure be invisible to an external observer. The finite-embedded transformation thus significantly broadens the range of materials that can be designed to include device-type structures capable of focusing or steering electromagnetic waves. Like transformation optical devices, the finite-embedded transform structures can be reflectionless under conditions that we describe below. The general methodology is graphically illustrated below for a parallel beam shifter.

FIG. 1 illustrates a possible linear coordinate transformation for this exemplary non-limiting design. Mathematically, the transformation in the grey shadowed region I shown in FIG. 1 is described by $$x'(x,y,z)=x$$

$$y'(x,y,z)=y+a(x+b)$$

$$z'(x,y,z)=z \tag{1-3}$$

As can be seen, the transformation only affects the y-coordinates while the x- and z-coordinates remain unchanged. The y-coordinates in FIG. 1 are thus tilted at an angle $\phi=a \tan(a)$, where a defines the slope of the slanted y-coordinate lines. Note that the coordinate transformation in the domains II and III are completely unrelated to the functionality of the beam shifter, as no electromagnetic fields penetrate into these regions.

The material properties in regions II and III can be arbitrarily chosen and do not have to be considered in the following discussion. As pointed out in D. Schurig et al, Opt. Express 14, 9794 (2006) and E. J. Post, Formal Structure of Electromagnetics, Dover Publications (1997), the material properties of a transformation-optical medium can be calculated as $$\epsilon^{i'j'}=\det(A_i^{i'})^{-1}A_i^{i'}A_j^{j'}\epsilon^{ij}$$

$$\mu^{i'j'}=\det(A_i^{i'})^{-1}A_i^{i'}A_j^{j'}\mu^{ij} \tag{4-5}$$

for a given coordinate transformation $x^{\alpha'}(x^\alpha)=A_\alpha^{\alpha'}x^\alpha$, where $A_\alpha^{\alpha'}$ is the Jacobi matrix and $\det(A_\alpha^{\alpha'})$ its determinant.

The coordinate systems at the interface at x=d between region I and free space appear to be discontinuous. As a discontinuous coordinate transformation can be considered as the limit of a continuous coordinate transformation, the discontinuous transition at the boundary at x=d may be taken into account in order to rigorously apply the same formalism as described in J. B. Pendry, et al., Science 312, 1780 (2006); and D. Schurig et al, Opt. Express 14, 9794 (2006), for the continuous coordinate transformation. In this case, the material properties at the interface will carry the character of the discontinuity at the boundary. Mathematically, the discontinuity at the interface between region I and free space can be described by $$x'(x,y,z)=x$$

$$y'(x,y,z)=\theta(d-x)[y+a(x+d)]+\theta(x-d)y$$

$$z'(x,y,z)=z \tag{6-8}$$

where $\theta(\xi)=1$ for $\xi>0$ and 0 for $\xi<0$. Calculating the permittivity and permeability tensors by use of equations (4-5), one obtains $$\varepsilon^{ij}=\mu^{ij}=\frac{1}{a_{22}}\begin{pmatrix} 1 & a_{12} & 0 \\ a_{12} & a_{12}^2+a_{22}^2 & 0 \\ 0 & 0 & 1 \end{pmatrix} \tag{9}$$

with $$a_{12}=\theta(d-x)a-\delta(x-d)[a(x+d)]$$

$$a_{22}=\theta(d-x)+\theta(x-d). \tag{10-11}$$

Refer to the Appendix for a more detailed mathematical analysis.

The material properties in equations (9-11) above can be interpreted in two distinct ways. In the first case, the transformation is considered to be discontinuous at the boundary, so that the interface has to be taken into account and the material properties at the boundary contain all terms in equations (10) and (11) above. The delta distribution, being the derivative of the Heaviside function, carries the signature of the discontinuity at the boundary between region I and free space in FIG. 1. As in the ray approximation, the y-coordinate lines in FIG. 1 represent the direction of the power flow for a beam propagating from x=−∞ . . . ∞, the inclusion of the delta distribution in the material parameters results in the trajectory indicated by the black arrows. The incoming wave will be shifted in the y-direction and abruptly be forced back on its old path at the boundary at x=d, thereby rendering the entire beam shifting section invisible to an observer.

The exemplary illustrative non-limiting implementation herein provides an alternate interpretation of the calculated material parameters. In this context, the discontinuity at the boundary is not considered in the calculation of the material properties. This means that the delta distribution, which is responsible for the backshift of the beam to its old path at x=d, is not included in equation (10). In other words, the material properties are calculated only within the transformation-optical material without taking the interface to free space into account and then embedded into free space. The linear coordinate transformation (I=1) for the design of a parallel beam shifter illustrated in FIG. 1 thus shows the space within the grey shadowed region $I(\Theta(h_1-|f_1'|)=1)$ is tilted at an angle $\phi=\arctan(\alpha)$ with respect to free space, which inherently results in a compression of space in region II and a dilution of space in region III. Considering the boundary between region I and free space, the coordinate systems are seen to be discontinuous at the interface x=d.

In more detail, it is useful to explain the difference between "embedded transformations" and "discontinuous transformations". Interpreting the transformation as discontinuous, the boundary must be taken into account and the transformation of the y-coordinate at the transition from region I and free space must read $$y'(x,y,z)=\Theta(d-x)[y+ak_1(x,y)]+\Theta(x-d)y \quad (18)$$

so that $a_{21}|_{(x=d)} \propto \delta(d-x)$. As in the ray approximation the y-coordinate lines in FIG. 1 represent the direction of the power flow for a beam propagating from $x=-\infty$ to $\infty$. The inclusion of the delta distribution in the material parameters would result in the trajectory indicated by the black arrows. The incoming wave would be shifted in the y-direction and abruptly be forced back on its old path at the boundary at x=d, thereby rendering the entire beam shifting section invisible to an observer. However, as can be seen from equation (4) immediately above, the boundary is not included in the calculation of the material properties for the beam shifter and beam splitter. The coordinate transformation is carried out locally for the transformation-optical medium and then embedded into free space which results in the trajectory indicated by the green arrows. The beam is shifted in the y-direction and maintains its lateral shift after exiting the transformation-optical medium.

This method is similar to the "embedded Green function" approach in the calculation of electron transport through interfaces (see, J. E. Inglesfield, J. Phys. C: Solid State Phys. 14, 3795 (1981), so that we refer to it as an "embedded coordinate transformation". For this case, the beam in FIG. 1 follows the green arrows. It is shifted in the lateral y-direction and preserves its lateral shift after exiting the transformation-optical medium. This alternative method of "embedded coordinate transformations" paves the way to a novel class of transformation-optical devices which are not invisible to an observer. Instead, the field manipulations are transferred from the transformation-optical medium to another medium.

At this point, the question arises as to which conditions must hold for the embedded transformation in order to design a reflectionless optical device. We found as a necessary—and in our investigated cases also sufficient—topological condition for our exemplary illustrative non-limiting implementation is that the metric in and normal to the interface between the transformation-optical medium and the non-transformed medium (in this case free space) must be continuous to the surrounding space. In the case of an exemplary illustrative non-limiting beam shifter, this means that the distances as measured along the x-, y- and z-axis in the transformation optical medium and free space must be equal along the boundary (x=d). As can be clearly seen from FIG. 1, this condition is fulfilled by the embedded coordinate transformation of the beam shifter within the green shadowed region I. The material properties in the domains II and III can be arbitrarily chosen as no fields penetrate into these regions.

A second, more sophisticated example a beam splitter is shown in FIG. 2 for the case of a nonlinear transformation of second order. The material properties are described by equation (16) in the Appendix with (p=2) and (l=2). This specific coordinate transformation is illustrated in FIG. 2. The underlying metric describes the gradual opening of a wedge-shaped slit in the y-direction. The metric in the x-direction is not affected by the transformation. Similar to the parallel beam shifter, the beam splitter obeys the topological condition in order to operate without reflection.

2D full-wave simulations can be carried out to adequately predict the electromagnetic behavior of waves impinging on a beam shifter and a beam divider, respectively. The calculation domain can be bounded by perfectly matched layers. The polarization of the plane waves can be chosen to be perpendicular to the x-y plane. Such 2D full wave simulations can be used to confirm the propagation properties of waves impinging on a transformation-optical parallel beam shifter.

FIG. 3 illustrates the phasor of the electric field with polarization in the direction perpendicular to the plane of propagation. The grey lines in FIG. 3 depict the power flow. The impinging beam is chosen to be convergent. We investigated the cases of perpendicular (FIGS. 3a+b) and oblique incidence (FIGS. 3c+d). In both cases the parallel beam shifter shifts the beam into the y-direction without altering the angle of the phase fronts. As predicted, the lateral shift is maintained after the beam exits the transformation-optical device. The parallel beam shifter is found to operate without reflection in agreement with the topological criterion we considered in the design process. The parallel beam shifter shows a well-designed behavior which cannot be achieved by conventional optical elements as it shifts the beam without tilting the phase fronts. The presented parallel beam shifter can play a crucial role in connection with tunable, reconfigurable metamaterials as it allows scanning of a beam focus along a flat surface without changing the plane of the focus and without introducing a beam tilt or aberrations. These properties become even more significant for applications where short working distances are used between scanner and object.

FIG. 4 shows an exemplary illustrative non-limiting electric field distribution (color map) and power flow lines (grey) of a parallel beam shifter for diffracting plane waves with shift parameters (a) a=1:8, (b) −1.8, for a convergent beam under perpendicular incidence with (c) a=2, (d)=−2 and for oblique incidence with (e) a=2 and (f) a=−1:2. FIG. 4 depicts the spatial distribution of the real part of the transverse-electric phasor (color map) and the direction of the power flow (grey lines) of propagating waves and oblique incidence (FIG. 4e-f). The curvature of the incoming wave fronts was freely chosen to be plane (a-b) or convergent (c-f). As can be seen from FIG. 4a-b, the beam shifter translates the incoming plane wave in the y-direction perpendicular to the propagation x-direction without altering the angle of the wave fronts. In contrast, the direction of the power flow changes by an angle $\phi=\arctan(\alpha)$ ($\alpha$: shift parameter) with respect to the power flow of the incoming plane wave. After propagation through the complex transformation-optical medium, the wave fronts and the power flow possess the same direction as the incoming beam, however the position of the wave is offset in the y-direction. The shift parameter a was arbitrarily chosen to be 1.8 (FIG. 3a) and −1.8 (FIG. 4b).

A similar behavior can be observed for waves with wave fronts of arbitrary curvature, as for example for convergent waves (FIG. 4c-f). In this case, the focus of the beam can be shifted within a plane parallel to the y-axis by variation of the shift parameter a. As is obvious from FIG. 4e-f, the same behavior applies for incoming waves at oblique incidence. The beam solely experiences a translation in the y-direction whereas the x-position of the focus remains unchanged. In all cases, the realized transformation-optical parallel beam shifter proves to operate without reflection confirming our metric criterion used for the design. The presented parallel beam shifter could play a crucial role in connection with tunable, reconfigurable metamaterials as it would allow scanning of a beam focus along a flat surface without changing the plane of the focus and without introducing a beam tilt or aberrations. These properties become even more significant for applications where short working distances are used between scanner and object.

As a second example for the strength of the new design tool, a transformation-optical beam splitter was conceived. FIG. 5 shows an example illustrative non-limiting electric field distribution (color map), power flow lines (grey) (a+d) and power flow on a linear (b+e) and logarithmic scale (c+f) of a beam splitter for diffracting plane waves with shift parameters (a–c) |a|=15 for perpendicular incident waves and (d–f) |a|=12 for oblique incidence. The 2D full wave simulation results are illustrated in FIG. 5a-f. FIGS. 5a-c and 5d-f show the spatial distribution of the transverse electric field (a+d) and the power flow on a linear (b+e) and a logarithmic scale (c+f) for normal and oblique incidence, respectively. The incoming beam is split into two beams with a small fraction of leaking fields in the gap due to scattering and diffraction. The beam splitter does not show any reflection.

In more detail, FIG. 5a shows exemplary illustrative non-limiting electric field distribution and the power flow lines for waves at perpendicular incidence. The beam splitter shifts one half of the wave in the (+y)-direction and the second half in the (−y)-direction, thus splitting the wave at the mid-point. The split waves are not perfectly parallel at the exit plane of the device due to diffraction of the incoming wave of finite width. As can be seen, there exists a small fraction of scattered fields within the split region which can be explained in terms of diffraction and scattering which is out of the scope of this letter. The beam splitter was found to operate without reflection in agreement with the metric criterion.

FIG. 5b shows an exemplary illustrative non-limiting display of the normalized power flow inside and outside the device. In order to enhance the contrast in the visualization of the power distribution at the beam splitter output, the color scale is saturated inside the beam splitter medium. As obvious from the transformation (FIG. 2), the power density inside the transformation optical medium is expected to be higher than outside the material, which is indicated by the density of the grid lines in FIG. 2 and confirmed by the simulations. The power flow density abruptly decreases at the output facet of the beam splitter. For clarification, FIG. 5c shows the power flow on a logarithmic scale. By integration of the power density inside the gap region between the beams and the power density inside either the upper or lower arm of the split beams a power ratio of 10:1 was calculated. The scattered waves in the gap carried about 4% of the total power.

In FIG. 5d-f, the spatial distribution of the transverse electric field (d) and the power flow on a linear (e) and a logarithmic scale (f) are shown for an obliquely incident wave on the beam splitter. Again, the beam is clearly divided into two beams with a small fraction of diffracted and scattered fields inside the gap between the split beams. As for perpendicular incidence, no reflection was observed in the simulation at both the input and output facet of the beam splitter. Similar to the result for perpendicular incidence, the propagation directions of the outgoing waves are not parallel. In addition, the angles of the central wave vectors of the split beams with refer to the central wave vector of the incident beam are not equal.

A further example beam focusing and expanding unit is shown in FIGS. 6a and 6b. Again the design was based on embedded coordinate transformations. Although the devices provide the aimed functionality of focusing and expanding electromagnetic waves, the devices are not reflectionless due to a metric mismatch at the right boundary between the transformation-optical devices and free space. However at this point, it is in principle possible to add anti-reflection-coatings at the right interface to suppress the reflections.

FIG. 7 shows a diagram of an exemplary illustrative non-limiting system for designing and manufacturing a transformation-optical device. Computing system or processor 100 comprises a programmable computer for accepting optical device parameters and transformation medium parameters. Computing system 100 uses these parameters to compute transformation coordinates for specifying dimensional metamaterial permittivity and permeability characteristics of an optical device in accordance with specific embedded coordinate transformations specific to the device. Computed two-dimensional or three-dimensional metamaterial fabrication process specifications are provided to optical device manufacturing process equipment 200 to produce an optical device having the desired transformation optical 300 characteristics.

FIG. 8 shows an exemplary illustrative non-limiting computer implemented process for designing and manufacturing transformation-optical devices using embedded coordinate transformations of electromagnetic permittivity and permeability tensors. The process includes:

computing a local form-invariant coordinate transformation of Maxwell's Equations for a transformation-optical medium of an optical device (block 302);

computing form-invariant coordinate transformations for a region surrounding the transformation-optical medium of the device (block 304);

embedding the local form-invariant computed coordinate transformation into free space region or a second surrounding optical medium defining the device (block 306); and providing the computed coordinate transformations to a metamaterial fabrication process equipment (block 308).

Figure 9:
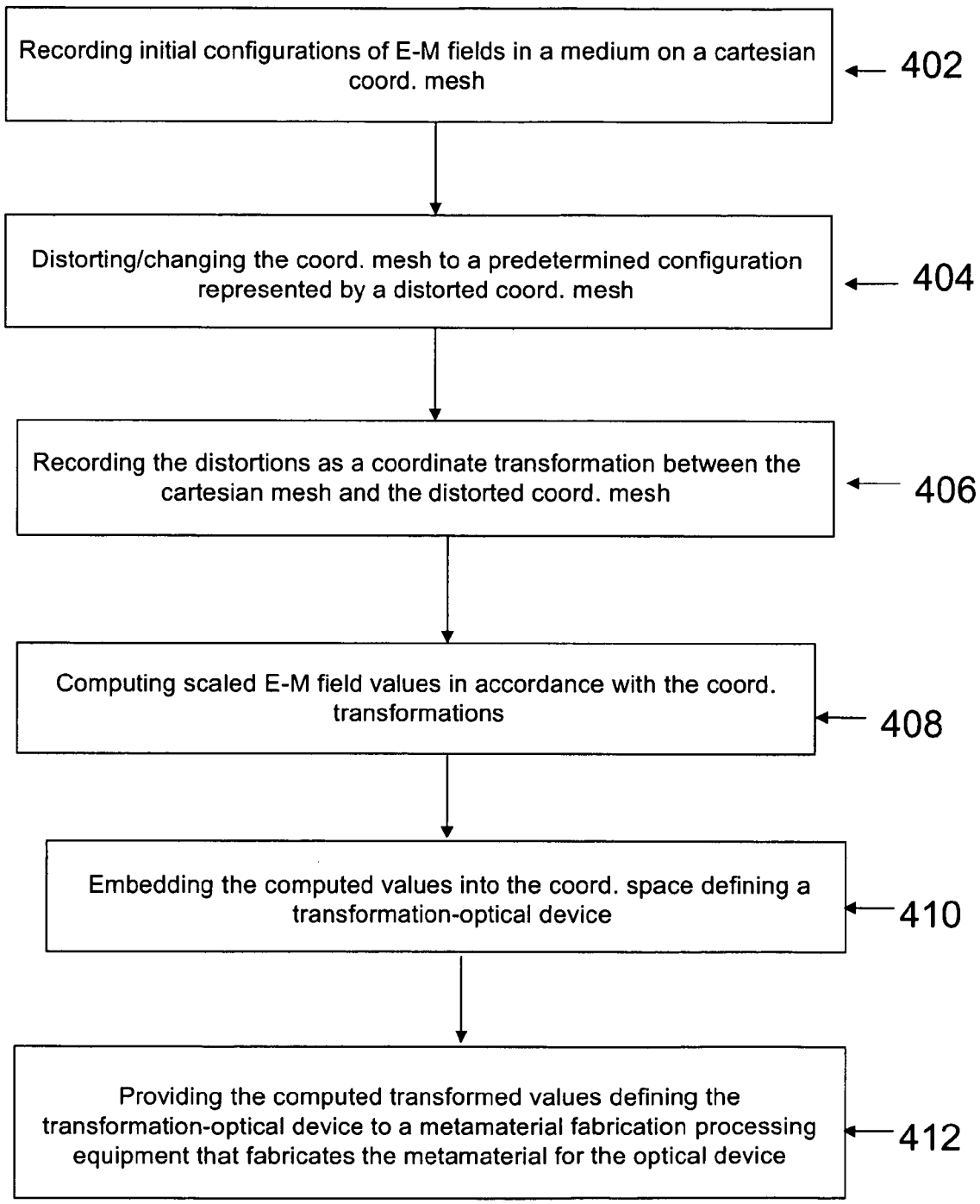
FIG. 9 shows another exemplary illustrative non-limiting computer implemented process for designing and manufacturing transformation-optical devices using embedded coordinate transformations of electromagnetic permittivity and permeability tensors.

FIG. 9 shows another exemplary illustrative non-limiting computer implemented process for designing and manufacturing transformation-optical devices using embedded coordinate transformations of electromagnetic permittivity and permeability tensors. The process includes:

recording initial configurations of E-M fields in a medium on a Cartesian coordinate mesh (block 402);

distorting/changing the Cartesian coordinate mesh to a predetermined configuration represented by a distorted coordinate mesh (block 404);

recording the distortions as a coordinate transformation between the Cartesian mesh and the distorted coordinate mesh (block 406);

computing scaled E-M field values permittivity $\epsilon$ and permeability $\mu$ values in accordance with the coordinate transformations (block 408);

embedding the computed E-M field values into the coordinate space defining a transformation-optical device (block 410), whereby transformations for the finite region of space defining a transformation-optic device are defined;

using the scaled $\mu$ and $\epsilon$ values to set/define the two-dimensional and/or three-dimensional spacial permittivity and permeability properties of a reconfigurable or non-reconfigurable transformation-optical structure/device composed of metamaterials; and providing the computed transformed values defining the transformation-optical device to a metamaterial fabrication processing equipment that fabricates the metamaterial for the optical device (block 412).

As should be clear from the above, all of the devices illustrated above can be realized in a relatively straightforward manner using artificially structured metamaterials. Techniques for designing these basic elements for metamaterials are now well-known to the community. One of the advantages of using metamaterials is that tunability can be implemented, allowing the materials to change dynamically between several transformation optical states, or continuously over a range of transformation-optical states. In this way, a set of dynamically reconfigurable devices to control electromagnetic waves can be designed into a structure that can also be used for load-bearing applications.

All publications cited above are hereby incorporated herein by reference.

While the technology herein has been described in connection with exemplary illustrative non-limiting implementations the invention is not to be limited by the disclosure. The invention is intended to be defined by the claims and to cover all corresponding and equivalent arrangements whether or not specifically disclosed herein.

APPENDIX

The mathematical formalism used for the calculation of the complex material properties is similar to the one reported in M. Rahm, D. Schurig, D. A. Roberts, S. A. Cummer, D. R. Smith, and J. B. Pendry (2007), arXiv:0706.2452v1 and D. Schurig, J. B. Pendry, and D. R. Smith, Opt. Expr. 14, 9794 (2006). For a given coordinate transformation $x^{\alpha'}(x^\alpha) = A_\alpha^{\alpha'} x^\alpha$ ($A_\alpha^{\alpha'}$: Jacobi matrix, $\alpha = 1 \ldots 3$), the electric permittivity $\epsilon^{i'j'}$ and the magnetic permeability $\mu^{i'j'}$ of the resulting material can be calculated by $$\epsilon^{i'j'} = [\det(A_i^{i'})]^{-1} A_i^{i'} A_j^{j'} \epsilon^{ij} \tag{1}$$

$$\mu^{i'j'} = [\det(A_i^{i'})]^{-1} A_i^{i'} A_j^{j'} \mu^{ij} \tag{2}$$

where $\det((A_i^{i'})$ denotes the determinant of the Jacobi matrix. For all the transformations carried out in this letter, the mathematical starting point is 3-dimensional euclidian space expressed in Cartesian coordinates with isotropic permittivities and permeabilities $\epsilon^{ij} = \epsilon_0 \delta^{ij}$ and $\mu^{ij} = \mu_0 \delta^{ij}$ ($\delta^{ij}$: Kronecker delta).

A possible coordinate transformation for the design of a parallel beam shifter and a beam splitter consisting of a slab with thickness 2d and height 2h can be expressed by $$x'(x, y, z) = x \tag{3}$$

$$y'(x, y, z) = \Theta(h_1 - |y|)[y + ak_l(x, y)] + \Theta(|y| - h_1)[y + \gamma(y)k_l(x, y)(y - s_2(y)h)] \tag{4}$$

$$z'(x, y, z) = z \tag{5}$$

with $$\Theta : \xi \to \Theta(\xi) := \begin{cases} 1 & \xi > 0 \\ 1/2 & \xi = 0 \\ 0 & \xi < 0 \end{cases} \tag{6}$$

$$k_l : (\eta, \kappa) \to k_l(\eta, \kappa) := s_p(\kappa)(\eta + d)^l \tag{7}$$

$$s_p : \xi \to s_p(\xi) := \begin{cases} 1 & p = 1 \\ \begin{cases} +1 & \xi \geq 0 \\ -1 & \xi < 0 \end{cases} & p = 2 \end{cases} \tag{8}$$

$$\gamma : \vartheta \to \gamma(\vartheta) := \frac{a}{s_2(\vartheta)(h_1 - h)} \tag{9}$$

where $2h_1$ is the maximum allowed width of the incoming beam, a determines the shift amount and $l = 1 \ldots n$ is the order of the nonlinearity of the transformation.

The transformation equations are defined for ($|x| \leq d$), ($|y| \leq h$) and $|z| <$ infinity). For the case p=1, equations (3)-(5) describe a parallel beam shifter whereas for p=2 the equations refer to a beam splitter. The Jacobi matrix of the transformation and its determinant are $$A_i^{i'} = \begin{pmatrix} 1 & 0 & 0 \\ a_{21} & a_{22} & 0 \\ 0 & 0 & 1 \end{pmatrix} \tag{10}$$

$$\det(A_i^{i'}) = a_{22} \tag{11}$$

with $$a_{21} = \Theta(h_1 - |f_1'|)[lak_{l-1}'] + \Theta(|f_2'| - h_1)[l\gamma' k_{l-1}'(f_2' - s_2(y')h)] \tag{12}$$

$$a_{22} = \Theta(h_1 - |f_1'|) + \Theta(|f_2'| - h_1)[1 + \gamma' k_l'] \tag{13}$$

where $$f_1' : (x', y') \to f(x', y') := y' - ak_l' \tag{14}$$

$$f_2' : (x', y') \to f(x', y') := \frac{y' - \gamma' k_l' s_2(y')h}{1 + \gamma' k_l'} \tag{15}$$

$$k_l' := k_l(x', y') \text{ and } \gamma' := \gamma(y').$$

By equations (1)-(2) immediately above, it is straightforward to calculate the tensors of the transformed relative electric permittivity $\epsilon_r = \epsilon/\epsilon_0$ and the relative magnetic permeability $\mu_r = \mu/\mu_0$, which in the material representation are obtained as $$\varepsilon_r^{ij} = \mu_r^{ij} = \frac{1}{a_{22}} g^{ij} \tag{16}$$

where $$g^{ij} = \begin{pmatrix} 1 & a_{21} & 0 \\ a_{21} & a_{21}^2 + a_{22}^2 & 0 \\ 0 & 0 & 1 \end{pmatrix} \tag{17}$$

is the metric tensor of the coordinate transformation. At this point it should be mentioned that only the domain with $\Theta(h_1 - |f_1'|) = 1$ has to be considered in the material implementation which simplifies the mathematical expressions.

We claim:

1. A process of fabricating a finite-embedded transform structure for use as a transformation-optical/transformation-electromagnetic device comprising: computing a local finite spatial coordinate transformation of Maxwell's equations over a spatial region to be occupied by a transformation medium of predetermined electromagnetic functionality; determining a spatial coordinate metric for a non-transformational second medium or spatial region adjacent or surrounding the transformation medium; embedding the computed local finite spatial coordinate transformation into the determined spatial coordinate metric for the second medium or spatial region adjacent or surrounding the transformation medium, wherein the embedded transformation meets a topological condition that a metric of the transformation medium in a direction normal and parallel to an interface between the transformation medium and said second medium or spatial region is continuous at a boundary to said second medium or spatial region; and fabricating a finite-embedded transform structure comprising a transformation medium using a metamaterial capable of manipulating propagating electromagnetic fields based at least in part on the computed local finite-embedded coordinate transformation.

2. The process of claim 1 further including fabricating the transformation medium to produce a non-reversible change in electromagnetic properties of electromagnetic waves propagating through said device.

3. The process of claim 2 further including transmitting the changed electromagnetic properties of the electromagnetic waves upon propagation of the waves from the transformation medium into said second medium or free space.

4. The process of claim 2 further including transmitting the changed electromagnetic properties of the electromagnetic waves upon propagation of the waves from the transformation medium into a different medium.

5. The process of claim 1 further including enabling transference of electromagnetic field manipulations by said transformation medium to a further propagation medium in a manner that is reflectionless.

6. A computer implemented method of designing transformation-optical/transformation-electromagnetic devices using a computed finite-embedded coordinate transformation of electromagnetic permittivity and permeability tensors comprising: computing, using a computer, a local finite spatial coordinate transformation of Maxwell's Equations over a spatial region to be occupied by a transformation medium of predetermined optical or electromagnetic functionality for use within a transformation-optical/transformation-electromagnetic device; setting a spatial coordinate metric for an adjacent medium or a free space region surrounding the transformation medium of the device; embedding the computed local finite spatial coordinate transformation into said spatial coordinate metric for an adjacent medium or free space region surrounding the transformation medium, wherein the embedded transformation meets a topological condition that a metric of the transformation medium in a direction normal and parallel to an interface between the transformation medium and said second medium or spatial region is continuous at a boundary to said second medium or spatial region; and providing at least the computed local finite-embedded spatial coordinate transform to metamaterial fabrication process equipment.

7. An embedded coordinate method of implementing effective functional designs of permittivity and permeability transformation in a transformation medium or structure for transformation-optical/transformation-electromagnetic devices, comprising: computing a local finite spatial coordinate transformation of Maxwell's equations over a spatial region to be occupied by a transformation medium or structure of a transformation-optical/transformation-electromagnetic device; selecting a spatial coordinate metric for a region immediately surrounding or adjacent the transformation medium device; embedding the computed local finite spatial coordinate transformation into the selected spatial coordinate metric for said region surrounding the transformation medium so that a metric of the transformation medium in a direction normal and parallel to an interface between the transformation medium and said surrounding or adjacent region is continuous at a boundary to said surrounding/adjacent region; and fabricating a finite-embedded transform structure comprising a transformation medium using a metamaterial capable of manipulating propagating electromagnetic fields based at least in part on the computed local finite-embedded coordinate transformation.

8. A method of implementing effective permittivity and permeability transformation design of a finite-embedded transform structure for use in transformation-optical/transformation-electromagnetic devices, comprising: computing, using a computer, a localized finite spatial coordinate transformation of permittivity and permeability to be produced by a transformation medium of a transformation-optical/electromagnetic device; defining a spatial coordinate metric for a spatial region or second medium immediately adjacent or surrounding the transformation medium; and embedding the computed localized finite spatial coordinate transformation into said defined spatial coordinate metric of said spatial region or second medium immediately adjacent or surrounding the transformation medium, wherein the computed finite-embedded coordinate transformation meets a topological condition that a metric of the transformation medium in a direction normal and parallel to an interface between the transformation medium and said spatial region or second medium is continuous at a boundary to said spatial region or second medium, thereby effecting a transference of altered permittivity and permeability characteristics of an electromagnetic field propagating between the transformation medium and said spatial region or second medium.

9. An electromagnetic wave/photonic beam-splitter, comprising: a finite-embedded transform structure comprising an electromagnetic field transformation medium formed of a metamaterial structured to output at least a one-dimensional beam-splitting of propagating electromagnetic waves in a direction of propagation of electromagnetic waves through the metamaterial, wherein beam-splitting characteristics of the metamaterial are characterized by setting a finite spatial local coordinate transformation corresponding to a spatial region occupied by said transformation medium, the spatial coordinate transformation describing a spatial metric within said region that exhibits a wedge-shaped split in at least one coordinate dimension in a direction parallel to a predetermined anticipated direction of electromagnetic wave propagation through the metamaterial, determining a spatial coordinate metric for a region adjacent or surrounding the transformation medium, embedding the finite spatial local coordinate transformation into the determined spatial coordinate metric for the region adjacent or surrounding the transformation medium, and using the resulting beam-splitting embedded spatial coordinate transform to specify electromagnetic field manipulation characteristics of the metamaterial forming the transformation medium.

10. An electromagnetic wave/photonic beam parallel-shifter, comprising:
a metamaterial having electromagnetic field transformation characteristics determined by computing a local finite spatial coordinate transformation corresponding to a predetermined distortion of free space over a predefined region to be occupied by the metamaterial, said predetermined distortion effecting a beam-shifting parallel spatial displacement of electromagnetic waves in a direction of propagation, determining a spatial metric for a region adjacent or surrounding the metamaterial, embedding the computed local finite coordinate transformation into the spatial metric for the region adjacent or surrounding the metamaterial, and using the resulting beam-shifting embedded spatial coordinate transform to specify electromagnetic field manipulation characteristics of the metamaterial; and means for directing electromagnetic radiation to the metamaterial.

11. An electromagnetic wave/photonic beam-focuser, comprising: a finite-embedded transform structure comprising an electromagnetic field transformation medium formed of a metamaterial structured to output at least a one-dimensional spatial focusing of electromagnetic waves in a direction orthogonal to a direction of propagation of electromagnetic waves through the metamaterial, wherein the metamaterial beam-focusing characteristics are characterized by setting a finite spatial local coordinate transformation corresponding to a compression-like distortion of free space over a predefined region to be occupied by the transformation medium, determining a spatial coordinate metric for a region adjacent or surrounding the transformation medium, embedding the finite spatial local coordinate transformation into the determined spatial coordinate metric for the region adjacent or surrounding the transformation medium, and using the resulting beam-focusing embedded spatial coordinate transform to specify electromagnetic field manipulation characteristics of the metamaterial forming the transformation medium.

12. An electromagnetic wave/photonic beam-expander, comprising: a finite-embedded transform structure comprising an electromagnetic field transformation medium formed of a metamaterial structured to output at least a one-dimensional spatial expanding of propagating electromagnetic waves in a direction orthogonal to a direction of propagation of electromagnetic waves through the metamaterial, wherein the beam-expanding characteristics of the metamaterial are characterized by a finite spatial local coordinate transformation for producing a beam-expanding effect on propagating electromagnetic waves and corresponding to an expansion-like distortion of free space over a predefined region to be occupied by the transformation medium, determining a spatial coordinate metric for a region adjacent or surrounding the transformation medium, embedding the finite spatial local coordinate transformation into the determined spatial coordinate metric for the region adjacent or surrounding the transformation medium, and using the resulting beam-expanding embedded spatial coordinate transform to specify electromagnetic field manipulation characteristics of a metamaterial used to form said transformation medium.

13. The process of claim 1 wherein the device is fabricated as an inhomogeneous and anisotropic structure capable of propagating electromagnetic waves.

14. The apparatus of claim 9 wherein the metamaterial is comprised of an anisotropic inhomogeneous material.

15. The apparatus of claim 10 wherein the metamaterial is comprised of an anisotropic inhomogeneous material.

16. The apparatus of claim 11 wherein the metamaterial is comprised of an anisotropic inhomogeneous material.

17. The apparatus of claim 12 wherein the metamaterial is comprised of an anisotropic inhomogeneous material.

18. The method of claim 7 wherein electromagnetic field manipulations produced by a transformation medium on an electromagnetic wave propagating through a first transformation medium are transferred to an adjacent second medium or free space, and wherein continuity of the permittivity and permeability transformation is maintained across a medium-to-medium or medium-to-free space interface.

19. The process of claim 1 wherein the finite-embedded transform structure produces optical or electromagnetic beam splitting.

20. The process of claim 1 wherein the finite-embedded transform structure produces optical or electromagnetic beam parallel-shifting.

21. The process of claim 1 wherein the finite-embedded transform structure produces optical or electromagnetic beam focusing.

22. The process of claim 1 wherein the finite-embedded transform structure produces optical or electromagnetic beam expanding.

23. An electromagnetic wave/photonic beam parallel-shifter, comprising: a finite-embedded transform structure comprising an electromagnetic field transformation medium formed of a metamaterial structured to produce at least a one-dimensional spatial shifting of propagating electromagnetic waves in a direction orthogonal to a direction of propagation of electromagnetic waves through the metamaterial, wherein beam-shifting characteristics of the metamaterial is characterized by setting a local finite spatial coordinate transformation corresponding to a spatial region occupied by the transformation medium, the spatial coordinate transformation describing a spatial metric within said region that exhibits a transverse linear shift of at least one coordinate dimension in a direction parallel to a predetermined anticipated direction of electromagnetic wave propagation through the metamaterial, determining a spatial coordinate metric for a region adjacent or surrounding the transformation medium, embedding the finite spatial local coordinate transformation into the determined spatial coordinate metric for the region adjacent or surrounding the transformation medium, and using the resulting beam-shifting embedded spatial coordinate transform to specify electromagnetic field manipulation characteristics of a metamaterial used to form the transformation medium.

24. An electromagnetic wave/photonic beam-splitter, comprising:

a transformation-optical medium formed of a metamaterial characterized in that its material properties are defined by tensors of relative electric permittivity $\epsilon_r = \epsilon/\epsilon_0$ and relative magnetic permeability $\mu_r = \mu/\mu_0$, which in a material are represented as $$\epsilon_r^{ij} = \mu_r^{ij} = \frac{1}{a_{22}} g^{ij} \quad (16)$$

where $$g^{ij} = \begin{pmatrix} 1 & a_{21} & 0 \\ a_{21} & a_{21}^2 + a_{22}^2 & 0 \\ 0 & 0 & 1 \end{pmatrix} \quad (17)$$

is the metric tensor of an embedded spatial coordinate transformation wherein the coordinate transformation has an underlying metric which describes an opening of a wedge-shaped slit in a direction parallel to a direction of electromagnetic wave propagation through the metamaterial, and which satisfies a topological condition that a metric in and normal to an interface between the transformation-optical medium and an adjacent surrounding non-transformation medium or region is continuous.

25. An electromagnetic wave/photonic beam-shifter, comprising:
a transformation-optical medium formed of a metamaterial characterized in that its material properties are defined by tensors of relative electric permittivity $\epsilon_r=\epsilon/\epsilon_0$ and relative magnetic permeability $\mu_r=\mu/\mu_0$, which in a material are represented as $$\epsilon_r^{ij} = \mu_r^{ij} = \frac{1}{a_{22}} g^{ij} \qquad (16)$$

where $$g^{ij} = \begin{pmatrix} 1 & a_{21} & 0 \\ a_{21} & a_{21}^2 + a_{22}^2 & 0 \\ 0 & 0 & 1 \end{pmatrix} \qquad (17)$$

is the metric tensor of an embedded spatial coordinate transformation wherein the coordinate transformation has an underlying metric which exhibits a region of transverse linear shifting of at least one dimension in a direction parallel to a direction of electromagnetic wave propagation through the metamaterial, and which satisfies a topological condition that a metric in and normal to an interface between the transformation-optical medium and an adjacent surrounding non-transformation medium or region is continuous.

26. An electromagnetic wave/photonic beam-shifter, comprising:
a transformation-optical medium formed of a metamaterial characterized in that material properties of the metamaterial cause a predetermined amount of diffracting or lateral shifting of impinging electromagnetic plane waves in a direction orthogonal to a direction of propagation through the metamaterial without producing alteration or tilting of an angle of impinging phase fronts, and
wherein its material properties conform to a predetermined topological condition at the medium boundaries such that propagation of the electromagnetic waves across medium boundaries occurs without significant reflection, and wherein the amount of lateral parallel shifting of the beam is maintained after the beam exits the transformation-optical medium.

27. An electromagnetic wave/photonic beam-scanning device, comprising:
a transformation-optical medium formed of a metamaterial characterized in that material properties of the metamaterial cause a predetermined amount of diffracting or lateral shifting of impinging electromagnetic plane waves in a direction orthogonal to a direction of propagation through the metamaterial without producing alteration or tilting of an angle of impinging phase fronts, and
wherein said material properties conform to a predetermined topological condition at the medium boundaries such that propagation of the electromagnetic waves across medium boundaries occurs without significant reflection and the amount of lateral shifting of the beam is maintained after the beam exits the transformation-optical medium, and
further wherein a transverse movement of the transformation-optical medium with respect to an impinging electromagnetic wave or photonic beam causes a transverse scanning of a beam focus of the electromagnetic wave or photonic beam upon exiting at an opposite side of the transformation-optical medium without significantly altering the plane of focus and without introducing significant tilt or aberration to the exiting electromagnetic wave or photonic beam.

* * * * *